United States Patent [19]

Taguchi

[11] Patent Number: 4,758,992

[45] Date of Patent: Jul. 19, 1988

[54] METHOD AND DEVICE FOR REFRESHING DYNAMIC SEMICONDUCTOR MEMORY DEVICE

[75] Inventor: Masao Taguchi, Sagamihara, Japan

[73] Assignee: Fujitsu Limited, Kanagawa, Japan

[21] Appl. No.: 895,112

[22] Filed: Aug. 11, 1986

[30] Foreign Application Priority Data

Aug. 16, 1985 [JP] Japan ............... 60-179274

[51] Int. Cl.⁴ .............................. G11C 7/00
[52] U.S. Cl. .................... 365/222; 365/201; 371/21
[58] Field of Search ........... 365/201, 222; 371/21, 371/49

[56] References Cited

U.S. PATENT DOCUMENTS

4,183,096  1/1980  Cenker et al. ............. 365/222
4,412,314  10/1983  Proebsting .................. 365/222

Primary Examiner—Joseph A. Popek
Attorney, Agent, or Firm—Armstrong, Nikaido, Marmelstein & Kubovcik

[57] ABSTRACT

A method and device for refreshing a dynamic semiconductor memory device comprising a memory cell array having a matrix arrangement of memory cells each designated by a row address and a column address and an error checking and correcting circuit, where the row address is received from an exterior in response to a row address strobe signal and the column address is received from the exterior in response to a column address strobe signal, performs a refresh operation when the column address strobe signal becomes low before the row address strobe signal, and selectively performs refresh operations with and without an error checking and correcting operation of the error checking and correcting circuit depending on timings of the row and column address strobe signals.

14 Claims, 6 Drawing Sheets

METHOD AND DEVICE FOR REFRESHING DYNAMIC SEMICONDUCTOR MEMORY DEVICE

BACKGROUND OF THE INVENTION

The present invention generally relates to methods and devices for refreshing dynamic semiconductor memory devices having an error checking and correcting circuit (hereinafter simply referred to as an ECC circuit), and more particularly to a method and device for selectively performing in the dynamic semiconductor memory device refresh operations with and without an error checking and correcting operation of the ECC circuit.

Recently, as the integration density of a metal oxide semiconductor (MOS) dynamic random access memory (DRAM) is improved from 64 Kb to 256 Kb and 1 Mb, the storage capacitance of one memory cell becomes small. As a result, the soft error rate caused by α-particles becomes large. A DRAM having a built-in (or on-chip) ECC circuit for the purpose of reducing such soft error rate is known. For example, such a DRAM is described in "A Submicron VLSI Memory with a 4b-at-a-time Built-in ECC Circuit" by J. Yamada, T. Mano, J. Inoue and S. Nakajima, ISSCC Technical Digest, pp 104-105, 1984, "A Self-correcting Circuit in 1Mb DRAM" by Date, Yamada and Mano, Institute of Electronics and Communication Engineers (Denshi Tsushin Gakkai), Material of the Society for the Study of Semiconductor Transistor, SSD84-21, pp 51-8, May 1984, and "A Submicron VLSI Memory with a 4b-at-a-time Built-in ECC Circuit" by J. Yamada, T. Mano, J. Inoue, S. Nakajima and T. Matsuda, IEEE Journal of Solid State Circuits, Vol. SC19, No. 5, pp 627-633, October 1984.

In the DRAM having the built-in ECC circuit, a plurality of memory cells at specific addresses of a memory cell array are divided into horizontal and vertical cell groups according to a predetermined method, and the so-called bi-directional parity checking (or horizontal-vertical parity checking) is employed wherein parity check information for each of the horizontal and vertical cell groups is stored in a cell array for the parity checking. When reading out the data from a certain memory cell, the parities of the memory cells belonging to the same horizontal and vertical cell groups as the certain memory cell are subjected to an arithmetic operation. Parities obtained as a result of the arithmetic operation are compared with corresponding parities stored in the cell array for the parity checking, and the data read out from the certain memory cell is corrected depending on the result of the comparison.

The error checking and correcting operation of the ECC circuit is performed simultaneously with a refresh operation in the DRAM. In other words, the so-called ECC patrol is performed by a read modify write mode in which the stored data in a specific memory cell is checked as the refresh operation is performed and the data is replaced by a correct data when an error is detected. The ECC patrol is an operation in which the error checking and correcting operation is performed for each unit of coded information. For example, in the case of a plurality of memory cells arranged in a matrix arrangement, rows (word lines) are successively designated by a refresh address counter in order to perform the refresh operation, and columns (bit line pairs) are successively designated by an ECC column address counter in order to perform the ECC patrol. In this case, when it is assumed that the refresh cycle is 8 msec and a bit length of one column is 1024 (that is, in the case of a 1 Mb DRAM), the period of the ECC patrol is approximately 8 sec. The count in the ECC column address counter is incremented for each refresh cycle, and thus, and the stored data in one column are checked and replaced by correct data in case of errors for each refresh cycle. As a result, one ECC patrol for all of the memory cells of the DRAM, that is, the period of the ECC patrol, can be obtained by (refresh cycle)×(bit length of one column) and the period of the ECC patrol in the case of the 1 Mb DRAM having the bit length of 1024 in one column is approximately 8 sec as described above.

When the ECC patrol is performed in the refresh mode, the time it takes to perform the refresh operation (that is, the so-called refresh overhead time) becomes considerably long compared to the refresh overhead time of a DRAM not having the built-in ECC circuit. Hence, the DRAM having the built-in ECC circuit suffers a disadvantage in that the refresh overhead time is extremely long. In the case of the DRAM not having the built-in ECC circuit, the refresh operation comprises the steps of selecting the word lines by the refresh address counter and driving the memory cells and sense amplifiers, and thereafter applying an initial voltage which is the same as that at the time of a write operation. In other words, the refresh operation of the DRAM not having the built-in ECC circuit simply comprises a first half of a read operation. On the other hand, in the case of the DRAM having the built-in ECC circuit, the refresh operation comprises in addition to the above steps the steps of checking the stored data and driving the write circuit.

During the refresh operation, that is, during the refresh overhead time, it is impossible to make access to the memory cells so as to perform the normal read and write operations. Therefore, it is desirable to shorten the refresh overhead time in order to improve the utilization efficiency of the memory device. Furthermore, in the case of the DRAM having the built-in ECC circuit, column-side (or Y-side) circuits such as a clock generator, column decoders and the ECC circuit must be driven during the refresh operation, and there is a problem in that the power consumption is higher than that of the DRAM not having the built-in ECC circuit.

SUMMARY OF THE INVENTION

Accordingly, it is a general object of the present invention to provide a novel and useful method and device for refreshing dynamic semiconductor memory device, in which the problems described heretofore are eliminated.

Another and more specific object of the present invention is to provide a method of refreshing a dynamic semiconductor memory device comprising a matrix arrangement of memory cells each designated by a row address and a column address and an ECC circuit, where the row address is received from an exterior in response to a row address strobe signal and the column address is received from the exterior in response to a column address strobe signal, and method comprises the steps of discriminating from timings of the row address strobe signal and the column address strobe signal that a refresh operation is to be performed in the memory device when the column address strobe signal becomes low before the row address strobe signal, and selectively performing the refresh operation with and without an error checking and correcting operation of the ECC circuit by discriminating from the timings of the row and column address strobe signals whether the refresh operation is to be performed with or without the error checking and correcting operation of the ECC circuit. According to the method of the present invention, it is possible to make increases in refresh overhead time and power consumption of the memory device substantially negligible by selectively performing the refresh operation with the error checking and correcting only once in a predetermined number of refresh operations.

Still another object of the present invention is to provide a device for refreshing a dynamic semiconductor memory device comprising a matrix arrangement of memory cells each designated by a row address and a column address and an ECC circuit, where the row address is received from an exterior in response to a row address strobe signal and the column address is received from the exterior in response to a column address strobe signal, and the device comprises a discriminating circuit for discriminating from timings of the row and column address strobe signals whether a refresh operation is to be performed with or without an error checking and correcting operation of the ECC circuit and for producing a discrimination signal having a level indicative of a discriminated result, a row-side clock generating circuit for producing a first clock signal for controlling row-side circuits of the memory device responsive to the row and column address strobe signals and for producing a first control signal when the column address strobe signal becomes low before the row address strobe signal becomes low, a column-side clock generating circuit for producing a second clock signal for controlling column-side circuits of the memory device responsive to the discrimination signal and the column address strobe signal, and a refresh control circuit for refreshing the memory device responsive to the first control signal from the row-side clock generating circuit, and the ECC circuit is controlled responsive to a second control signal produced from the column-side clock generating circuit. According to the device of the present invention, it is possible to make increases in refresh overhead time and power consumption of the memory device substantially negligible by selectively performing the refresh operation with the error checking and correcting only once in a predetermined number of refresh operations. In addition, it is unnecessary to provide an additional terminal on the memory device for discriminating whether the refresh operation is to be performed with or without the error checking and correcting operation.

A further object of the present invention is to provide a device for refreshing a dynamic semiconductor memory device comprising a matrix arrangement of memory cells each designated by a row address and a column address and an ECC circuit, where the row address is received from an exterior in response to a row address strobe signal and the column address is received from the exterior in response to a column address strobe signal, and the device comprises a row-side clock generating circuit for producing a first clock signal for controlling row-side circuits of the memory device responsive to the row and column address strobe signals and for producing a first control signal when the column address strobe signal becomes low before the row address strobe signal becomes low, a column-side clock generating circuit for producing a second clock signal for controlling column-side circuits of the memory device responsive to the column address strobe signal and the first clock signal, a refresh control circuit for refreshing the memory device responsive to the first control signal from the row-side clock generating circuit, and a gate circuit supplied with the column address strobe signal and the second clock signal for producing a second control signal, and the ECC circuit is controlled responsive to the second control signal produced from the gate circuit. According to the device of the present invention, it is possible to make increases in refresh overhead time and power consumption of the memory device substantially negligible by selectively performing the refresh operation with the error checking and correcting only once in a predetermined number of refresh operations. Moreover, it is unnecessary to provide an additional terminal on the memory device for discriminating whether the refresh operation is to be performed with or without the error checking and correcting operation.

Other objects and further features of the present invention will be apparent from the following detailed description when read in conjunction with the accompanying drawings.

DETAILED DESCRIPTION

Figure 1:
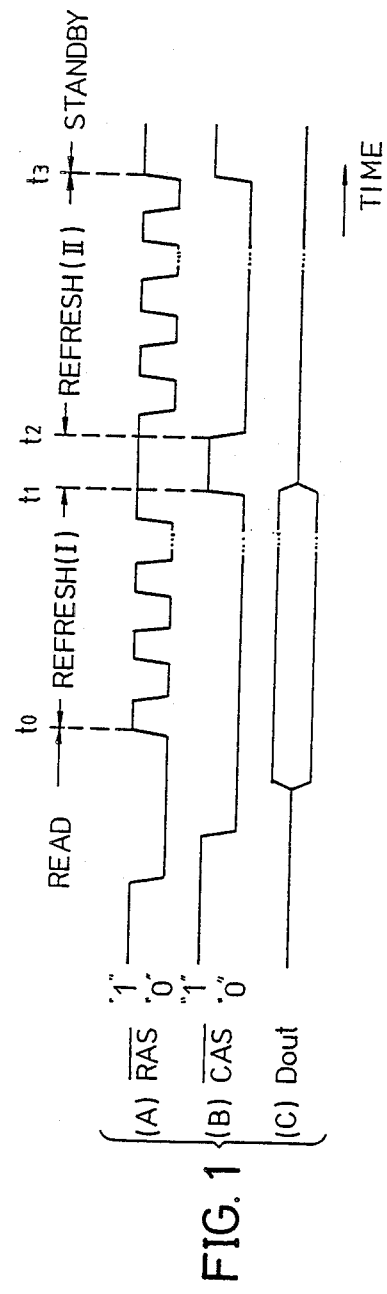
FIGS. 1(A) through 1(C) are timing charts for explaining a refresh operation of a conventional dynamic semiconductor memory device having a built-in ECC circuit.

First, description will be given with respect to a refresh operation of a conventional DRAM having a built-in ECC circuit, by referring to FIGS. 1(A) through 1(C). All of normal access operations such as a read operation are started when a row address strobe signal (hereinafter simply referred to as a $\overline{RAS}$ signal) becomes low (or "0") in a state where a column address strobe signal (hereinafter simply referred to as a $\overline{CAS}$ signal) is high (or "1"). On the other hand, in the case of the so-called "$\overline{CAS}$ before $\overline{RAS}$ refresh" operation, the refresh operation is started when the $\overline{CAS}$ signal becomes low before the $\overline{RAS}$ signal becomes low. In other words, the normal access operation is performed in the case where the $\overline{CAS}$ signal is high when the $\overline{RAS}$ signal becomes low, and the refresh operation is performed in the case where the $\overline{CAS}$ signal is low when the $\overline{RAS}$ signal becomes low.

The refresh operation is performed in accordance with a refresh address generated under an instruction of a built-in refresh row address counter of the DRAM, and thus, it is unnecessary to supply the refresh address from outside the DRAM. Accordingly, an access operation such as a read cycle occurs before a time t0 in FIGS. 1(A) through 1(C) which respectively show the $\overline{RAS}$ signal, $\overline{CAS}$ signal and an output data $D_{OUT}$ at an output data terminal. A refresh operation (I) which is often referred to as a hidden refresh operation is performed from the time t0 to a time t1. Another refresh operation (II) is performed from a time t2 to a time t3. The $\overline{CAS}$ signal shown in FIG. 1(B) is made high at the time t1 so that the impedance of the output data terminal becomes high. In each of the refresh operations (I) and (II), the refresh operation is started at a falling edge of the $\overline{RAS}$ signal shown in FIG. 1(A) and the refresh operation is ended at a rising edge of the $\overline{RAS}$ signal. The refresh row address is incremented when the refresh operation is ended. The refresh operations with the ECC operation is completed for all of the memory cells when such refresh operations are performed for one refresh cycle.

In FIGS. 1(A) and 1(B) and FIGS. 2(A), 2(B), 3(A), 3(B), 8(A), 8(B), 9(A) and 9(B) which will be described later on in the present specification, a standby state actually occurs before and after each refresh operation. However, in these figures, each refresh operation is shown inclusive of such standby states, for convenience' sake.

FIGS. 2(A) through 2(C) and FIGS. 3(A) through 3(C) are timing charts for explaining a first embodiment of the method of refreshing a dynamic semiconductor memory device according to the present invention. FIGS. 2(A) through 2(C) respectively show the $\overline{RAS}$ signal, $\overline{CAS}$ signal and the output data $D_{OUT}$ from the output data terminal for the case where the refresh operation is performed without the error checking and correcting operation of the ECC circuit. On the other hand, FIGS. 3(A) through 3(C) respectively show the $\overline{RAS}$ signal, $\overline{RAS}$ signal and the output data $D_{OUT}$ from the output data terminal for the case where the refresh operation is performed with the error checking and correcting operation of the ECC circuit.

When performing the refresh operation without the error checking and correcting operation of the ECC circuit in the present embodiment, the $\overline{RAS}$ signal is toggled in the state where the $\overline{CAS}$ signal is low during the refresh operation (I) from the time t0 to the time t1 and the refresh operation (II) from the time t3 to a time t4, as shown in FIGS. 2(A) and 2(B). Accordingly, the $\overline{CAS}$ signal is low when the $\overline{RAS}$ signal becomes low, and the "$\overline{RAS}$ before $\overline{RAS}$ refresh" operation is performed. An ECC circuit will not become activated unless the $\overline{CAS}$ signal becomes low, and the error checking and correcting operation will not be performed. The $\overline{CAS}$ signal is made high at the time t1 as in the conventional case described in conjunction with FIGS. 1(A) through 1(C) so that the impedance of the output data terminal becomes high.

During a refresh operation from the time t2 to the time t3, the refresh operation is performed with the error checking and correcting operation of the ECC circuit. However, since the $\overline{RAS}$ signal is toggled thereafter and becomes high, this refresh operation with the error checking and correcting operation is only performed for an extremely short time and the refresh operation without the error checking and correcting operation is performed from the time t3. Therefore, in the case shown in FIGS. 2(A) through 2(C), the refresh operations are performed substantially without the error checking and correcting operation.

Figure 3:
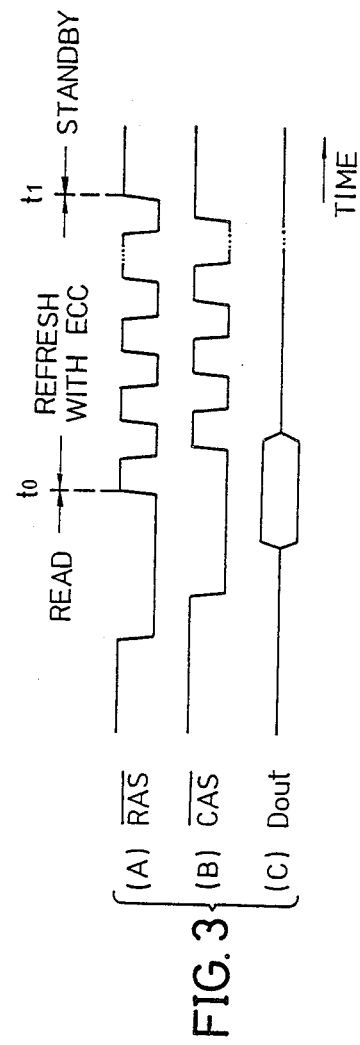

On the other hand, when performing the refresh operation with the error checking and correcting operation of the ECC circuit in the present embodiment, the $\overline{CAS}$ signal is made low before the $\overline{RAS}$ signal is toggled and the $\overline{CAS}$ signal is then toggled so that column-side circuits are activated for each refresh and the ECC circuit is operated. In other words, the $\overline{RAS}$ and $\overline{CAS}$ signals are toggled during the refresh operation as shown in FIGS. 3(A) and 3(B) so that the column-side circuit are activated for each refresh and the $\overline{RAS}$ signal is always low when the $\overline{RAS}$ signal becomes low.

Therefore, according to the present embodiment, it is possible to selectively perform the refresh operations with and without the error checking and correcting operation of the ECC circuit depending on the timings of the $\overline{RAS}$ and $\overline{CAS}$ signals. The refresh operations with and without the error checking and correcting operation are both "$\overline{RAS}$ before $\overline{RAS}$ refresh" operations, but it is possible to discriminate the refresh operations with and without the error checking and correcting operation by appropriately toggling the RAS and $\overline{CAS}$ signals.

Next, description will be given with respect to a first embodiment of the device for refreshing a dynamic semiconductor memory device according to the present invention, by referring to FIG. 4. In the present embodiment, the device of the present invention is applied to a DRAM having a built-in ECC circuit, and the refresh operations are performed in accordance with the timing charts shown in FIGS. 2(A) through 2(C) and 3(A) through 3(C). A memory cell array 11 has 256 Kb, for example, and word lines of the memory cell array 11 are selected by a row address buffer 12 and a row decoder 13. Bit lines of the memory cell array 11 are selected by a column address buffer 14 and a column decoder 15. A sense amplifier 16 includes input/output gates. In other words, the memory cell array 11 is a matrix arrangement of memory cells each designated by a row address and a column address, and the row address is received from an exterior in response to the $\overline{RAS}$ signal and the column address is received from the exterior in response to the $\overline{RAS}$ signal.

The row-side circuits including the row address buffer 12, the row decoder 13 and the sense amplifier 16 o are operated responsive to a precharging clock signal $\phi_R$ generated from a row-side clock generator 17. The clock signal $\phi_R$ actually consists of clock pulses having different timings, and the row-side circuits are supplied with respective clock pulses having different timings out of the clock signal $\phi_R$. The $\overline{RAS}$ and $\overline{RAS}$ signals from input terminals are supplied to the row-side clock generator 17. When the $\overline{CAS}$ signal becomes low before the $\overline{RAS}$ signal becomes low, the row-side clock generator 17 generates a clock signal $\phi_{REF}$ and operates a refresh control circuit 18 responsive to the clock signal $\phi_{REF}$ so as to perform a refresh operation. In other words, the refresh control circuit 18 successively designates the rows (word lines) via a refresh address counter 19, and successively designates the columns (bit lines) via the refresh address counter 19, a frequency divider 20 and a patrol address counter 21.

The frequency dividing ratio of the frequency divider 20 depends on the parity checking that is employed for the error checking and correcting. In the case of the error checking and correcting using the Hamming code, the frequency dividing ratio of the frequency divider 20 is appropriately set depending on the number of bits of the coded information. On the other hand, it is possible to omit the frequency divider 20 in the case of the bi-directional parity checking.

Figure 5:
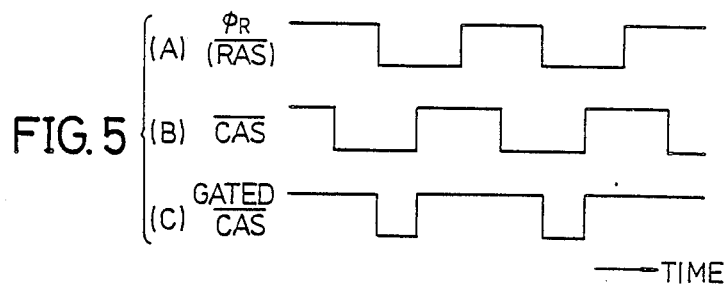
FIGS. 5(A) through 5(C) are timing charts for explaining the operation of the block system shown in FIG. 4.

The column decoder 15 which is one of the column-side circuits is operated by a precharging clock signal $\phi_C$ generated from a column-side clock generator 22. An ECC discriminating circuit 28 is supplied with the $\overline{RAS}$ and $\overline{CAS}$ signals from the input terminals and discriminates whether or not the error checking and correcting operation is to be performed. For example, the ECC discriminating circuit 28 produces a low-level discrimination signal when the error checking and correction is to be performed. The output discrimination signal of the ECC discriminating circuit 28 is supplied to one input terminal of a NOR circuit 29. On the other hand, the $\overline{CAS}$ signal shown in FIG. 5(B) and the clock signal $\phi_R$ shown in FIG. 5(A) from the row-side clock generator 17 are supplied to an OR circuit 23, and a gated $\overline{CAS}$ signal shown in FIG. 5(C) from the OR circuit 23 is supplied to another input terminal of the NOR circuit 29. The column-side clock generator 22 is supplied with an output signal of the NOR circuit 29. Instead of supplying the clock signal $\phi_R$ to the OR circuit 3, it is possible to obtain the gated $\overline{CAS}$ signal by supplying the $\overline{RAS}$ signal to the OR circuit 23 together with the $\overline{RAS}$ signal.

A write clock generator 24 is operated responsive to an output signal of the column-side clock generator 22 and a write enable signal ($\overline{WE}$ signal). An input data $D_{in}$ and an output signal of the write clock generator 24 are supplied to a data input buffer 25. An output data of the data input buffer 25 is supplied to an ECC circuit 26, and output data of the ECC circuit 26 is supplied to the data input buffer 25 and to a data output buffer 27 which outputs an output data $D_{OUT}$. The data output buffer 27 is supplied with the $\overline{CAS}$ signal. In FIG. 4, power source voltages Vcc and Vss are supplied to each of the circuit parts, but illustration thereof will be omitted.

External address signals A0 through A8 and address signals from the refresh address counter 19 are multiplexed by a first internal multiplexer (not shown) of the row address buffer 12 and are supplied to the row address buffer 12. In the refresh mode, the first internal multiplexer supplies the address signals from the refresh address counter 19 to the row address buffer 12. Similarly, the external address signals A0 through A8 and address signals from the patrol address counter 21 are multiplexed by a second internal multiplexer (not shown) of the column address buffer 14 and are supplied to the column address buffer 14. In the refresh mode, the second internal multiplexer supplies the address signals from the patrol address counter 21 to the column address buffer 14. The external address signals A0 through A8 are time divisionally transferred as the row address and the column address.

All of normal access operations such as the read operation are started when the $\overline{RAS}$ signal becomes low in a state where the $\overline{CAS}$ signal is high, and the $\overline{CAS}$ signal becomes low after the $\overline{RAS}$ signal becomes low. As a result, the read cycle is performed when the clock signal $\phi_R$ is generated from the row-side clock generator 17 and the clock signal $\phi_C$ is thereafter generated from the column-side clock generator 22. Since the the $\overline{CAS}$ signal and the clock signal $\phi_R$ are supplied to the OR circuit 23, the output gated $\overline{CAS}$ signal of the OR circuit 23 is high when the $\overline{RAS}$ signal becomes high even when the $\overline{CAS}$ signal is low. The column-side clock generator 22 is supplied with the output signal of the NOR circuit 29 which is supplied with the gated $\overline{CAS}$ signal from the OR circuit 23 and the discrimination signal from the ECC discriminating circuit 28, and thus, the column-side circuits are automatically activated responsive to the clock signal $\phi_C$. In the read cycle, the ECC circuit 26 is activated responsive to an output signal of the column-side clock generator 22 at the same time as activating the column-side circuits, and the ECC circuit 26 checks the output data $D_{OUT}$ which is to be outputted via the data output buffer 27.

Figure 2:
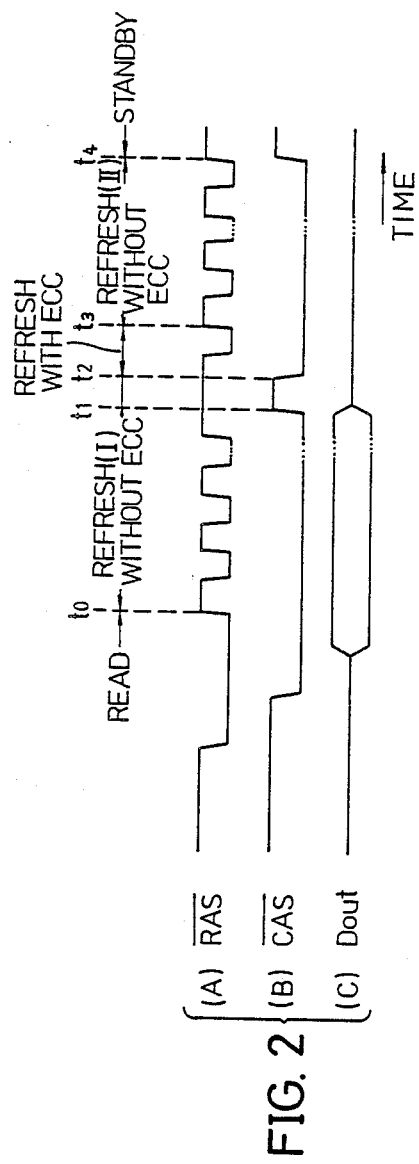
FIGS. 2(A) through 2(C) and FIGS. 3(A) through 3(C) are timing charts for explaining a first embodiment of the method of refreshing a dynamic semiconductor memory device according to the present invention.

When the $\overline{RAS}$ signal toggles from the time t0 to the time t1 and from the time t3 to the time t4 as shown in FIG. 2 (A), that is, when the $\overline{RAS}$ signal toggles in the state where the $\overline{CAS}$ signal remains low as shown in FIG. 2 (B), the row-side clock generator 17 operates the refresh control circuit 18 and the row-side circuits including the row address buffer 12, the row decoder 13 and the sense amplifier 16. However, since the $\overline{CAS}$ signal is low, the column-side circuits and the ECC circuit 26 are not activated.

On the other hand, from the time t0 to the time t1 in FIGS. 3(A) and 3(B), the $\overline{CAS}$ signal is made low before the $\overline{RAS}$ signal is toggled and the $\overline{CAS}$ signal is then toggled so that column-side circuits are activated responsive to the clock signal $\phi_C$ for each refresh and the ECC circuit 26 is operated responsive to the output signal of the column-side clock generator 22. In other words, the $\overline{RAS}$ and $\overline{CAS}$ signals are toggled during the refresh operation as shown in FIGS. 3(A) and 3(B) so that the column-side circuit are activated for each refresh and the $\overline{CAS}$ signal is always low when the $\overline{RAS}$ signal becomes low. As a result, the output data $D_{OUT}$ to be outputted via the data output buffer 27 is checked by the ECC circuit 26, and in case of error the correct data is written to replace the erroneous data via the data input buffer 25. In FIG. 3(A), the toggle width of the $\overline{RAS}$ signal must be greater than that of the $\overline{RAS}$ signal shown in FIG. 2(A) by an amount corresponding to the error checking and correcting that is performed by the ECC circuit 26.

Figure 4:
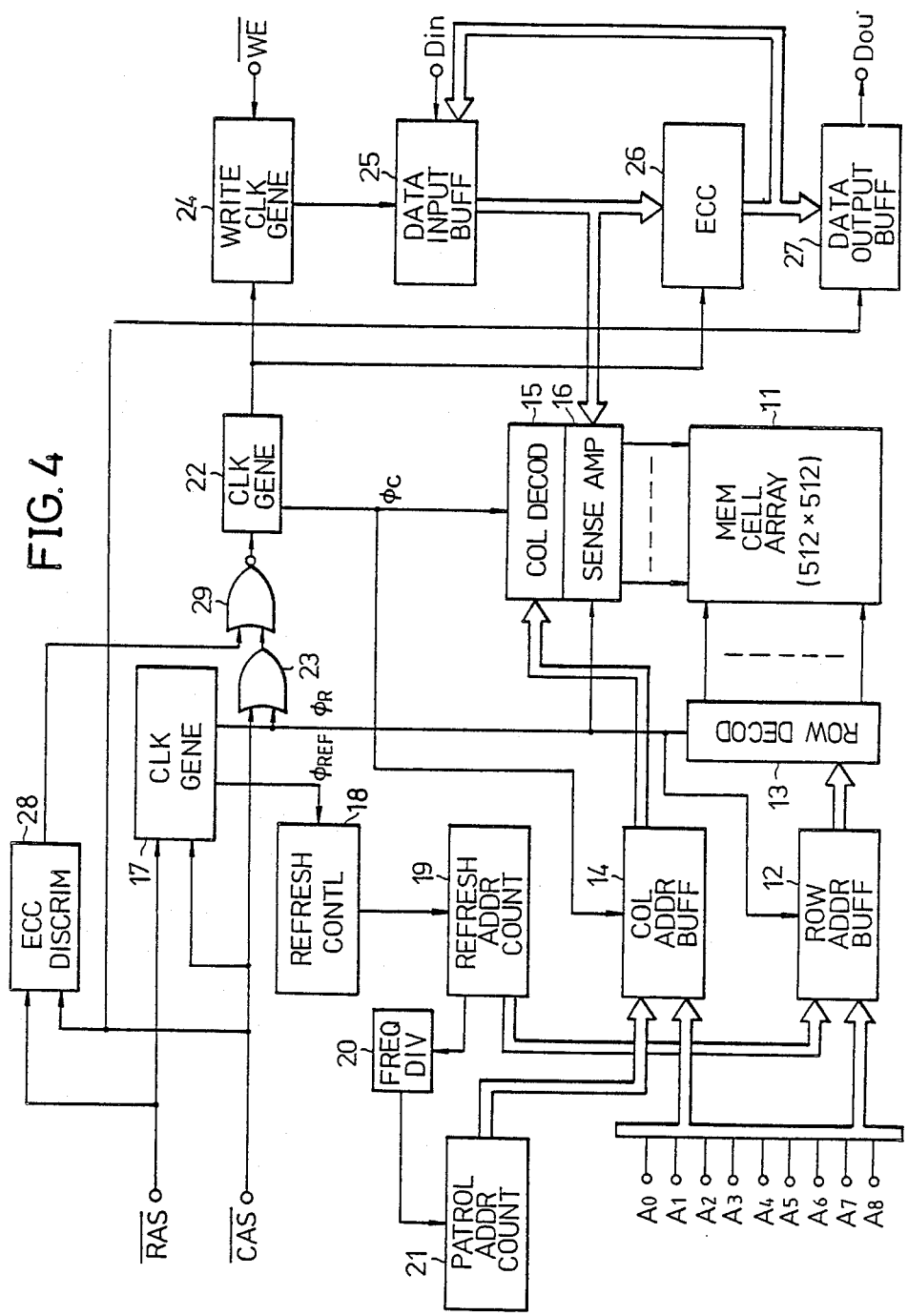
FIG. 4 is a system block diagram showing a first embodiment of the device for refreshing a dynamic semiconductor memory device according to the present invention.

Therefore, when the circuit shown in FIG. 4 is operated by the $\overline{RAS}$ and $\overline{CAS}$ signals having the timings shown in FIGS. 2(A) and 2(B), the refresh operation without the error checking and correcting operation of the ECC circuit 26 is performed. On the other hand, when the circuit is operated by the $\overline{RAS}$ and $\overline{CAS}$ signals having the timings shown in FIGS. 3(A) and 3(B), the refresh operation with the error checking and correcting operation of the ECC circuit is performed.

According to the present embodiment, the column-side clock generator 22 is supplied with the gated $\overline{CAS}$ signal which is obtained from the OR circuit 23 via the NOR circuit 29. For this reason, the ECC circuit 26 is operated during the normal access operation including the read cycle, the RAS-CAS mode and the page mode.

Figure 6:
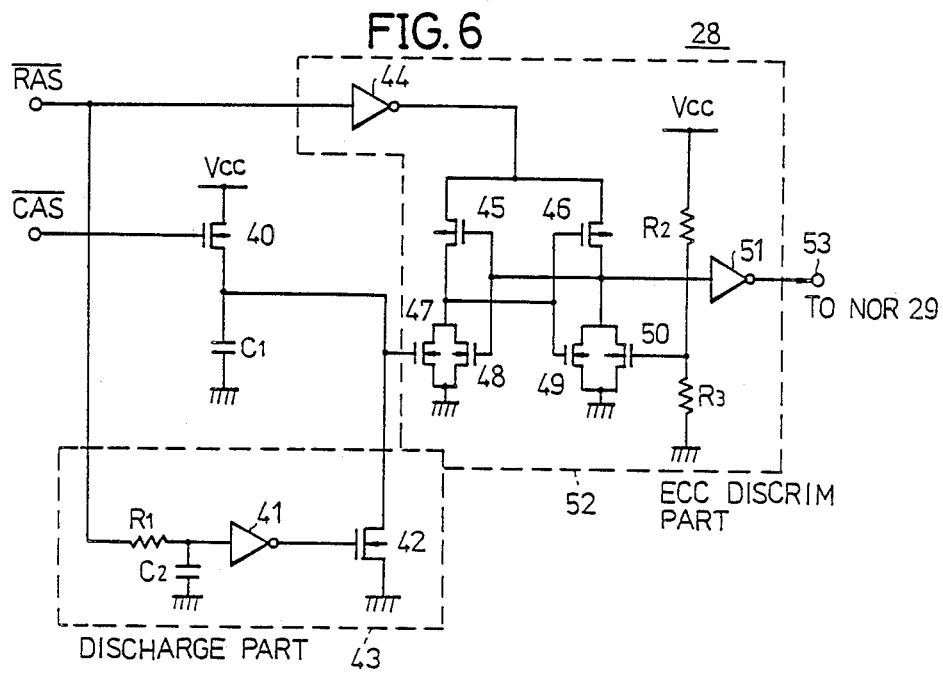
FIG. 6 is a circuit diagram showing an embodiment of an essential part of the block system shown in FIG. 4.

FIG. 6 shows an embodiment of the ECC discriminating circuit 28 shown in FIG. 4. The ECC discriminating circuit 28 generally comprises an N-channel transistor 40, a capacitor C1, a discharge part 43, and an ECC discriminating part 52. The discharge circuit 43 comprises a resistor R1, a capacitor C2, an inverter 41 and an N-channel transistor 42. The ECC discriminating part 52 comprises inverters 44 and 51, P-channel transistors 45 and 46, N-channel transistors 47 through 50, and resistors R2 and R3.

When the $\overline{CAS}$ signal remains low as shown in FIG. 2(B), the transistor 40 is OFF and an output discrimination signal obtained at an output terminal 53 remains high even when the $\overline{RAS}$ signal toggles as shown in FIG. 2(A). Thus, a high-level discrimination signal is obtained in the case of the refresh operation without the error checking and correcting. On the other hand, when the $\overline{RAS}$ and $\overline{CAS}$ signals toggle as shown in FIGS. 3(A) and 3(B), the transistor 40 is turned ON and OFF responsive to the $\overline{CAS}$ signal and the transistor 42 discharges the charge in the capacitor C1 responsive to the low-level $\overline{RAS}$ signal with a predetermined delay provided by the resistor R1 and the capacitor C2. As a result, the discrimination signal obtained at the output terminal 53 becomes low and is maintained low while the $\overline{RAS}$ and $\overline{CAS}$ signals toggle as shown in FIGS. 3(A) and 3(B) due to the switching operation of the ECC discriminating part 52. Hence, a low-level discrimination signal is obtained in the case of the refresh operation with the error checking and correcting.

Figure 7:
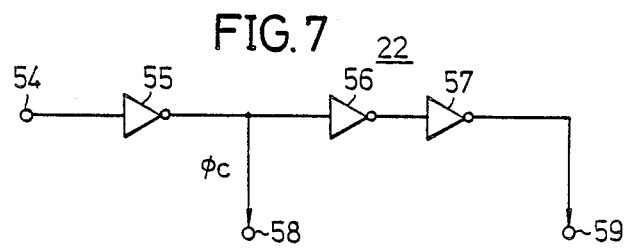
FIG. 7 is a circuit diagram showing an embodiment of another essential part of the block system shown in FIG. 4.

FIG. 7 shows an embodiment of the column-side clock generator 22 shown in FIG. 4. The column-side clock generator 22 generally comprises inverters 55, 56 and 57. The output signal of the NOR circuit 29 is applied to an input terminal 54. The signal applied to the input terminal 54 is inverted in the inverter 55 and is outputted via an output terminal 58 as the clock signal $\phi_C$. On the other hand, the output signal of the inverter 55 is passed through the inverters 56 and 57 which constitute a delay circuit, and is outputted via an output terminal 59 as the output signal of the column-side clock generator 22 for controlling the ECC circuit 26 and the write clock generator 24 shown in FIG. 4.

Figure 8:
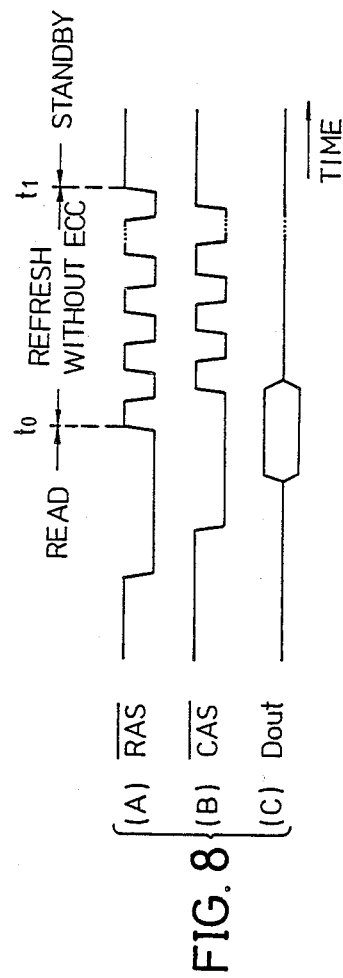
FIGS. 8(A) through 8(C) and FIGS. 9(A) through 9(C) are timing charts for explaining a second embodiment of the method of refreshing a dynamic semiconductor memory device according to the present invention.

FIGS. 8(A) through 8(C) and FIGS. 9(A) through 9(C) are timing charts for explaining a second embodiment of the method of refreshing a dynamic semiconductor memory device according to the present invention. FIGS. 8(A) through 8(C) respectively show the $\overline{RAS}$ signal, $\overline{CAS}$ signal and the output data $D_{OUT}$ from the output data terminal for the case where the refresh operation is performed without the error checking and correcting operation of the ECC circuit. On the other hand, FIGS. 9(A) through 9(C) respectively show the $\overline{RAS}$ signal, $\overline{CAS}$ signal and the output data $D_{OUT}$ from the output data terminal for the case where the refresh operation is performed with the error checking and correcting operation of the ECC circuit.

When performing the refresh operation without the error checking and correcting operation of the ECC circuit in the present embodiment, the $\overline{RAS}$ and $\overline{CAS}$ signals are toggled during the refresh operation from the time t0 to the time t1, as shown in FIGS. 8(A) and 8(B). The $\overline{RAS}$ and $\overline{CAS}$ signals are toggled during the refresh operation so that the $\overline{CAS}$ signal is low when the $\overline{RAS}$ signal becomes low, and the "$\overline{CAS}$ before $\overline{RAS}$ refresh" operation is performed. In this case, the row-side circuits are operated when the $\overline{RAS}$ signal becomes low, but the $\overline{CAS}$ signal becomes high within a predetermined time so as to stop further operation of the column-side circuits. Hence, the ECC circuit will not become activated unless the $\overline{CAS}$ signal becomes low, and the error checking and correcting operation will not be performed.

Figure 9:
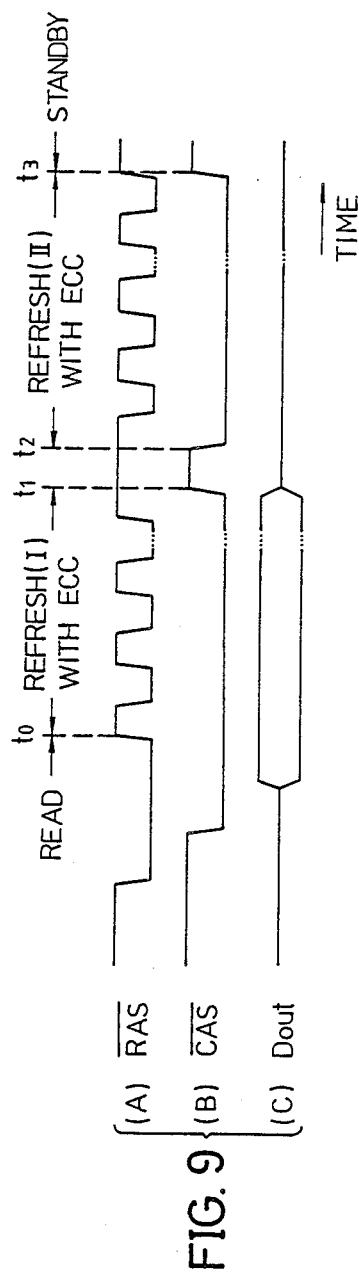

On the other hand, when performing the refresh operation with the error checking and correcting operation of the ECC circuit in the present embodiment, the $\overline{RAS}$ signal is toggled in the state where the $\overline{CAS}$ signal remains low as shown in FIGS. 9(A) and 9(B) so that column-side circuits are activated for each refresh and the ECC circuit is operated. In other words, the refresh operation with the error checking and correcting is substantially the same as that shown in FIGS. 1(A) through 1(C).

Therefore, according to the present embodiment, it is possible to selectively perform the refresh operations with and without the error checking and correcting operation of the ECC circuit depending on the timings of the $\overline{RAS}$ and $\overline{CAS}$ signals. The refresh operations with and without the error checking and correcting operation are both "$\overline{CAS}$ before $\overline{RAS}$ refresh" operations, but it is possible to discriminate the refresh operations with and without the error checking and correcting operation by appropriately toggling the $\overline{RAS}$ and $\overline{CAS}$ signals.

Figure 10:
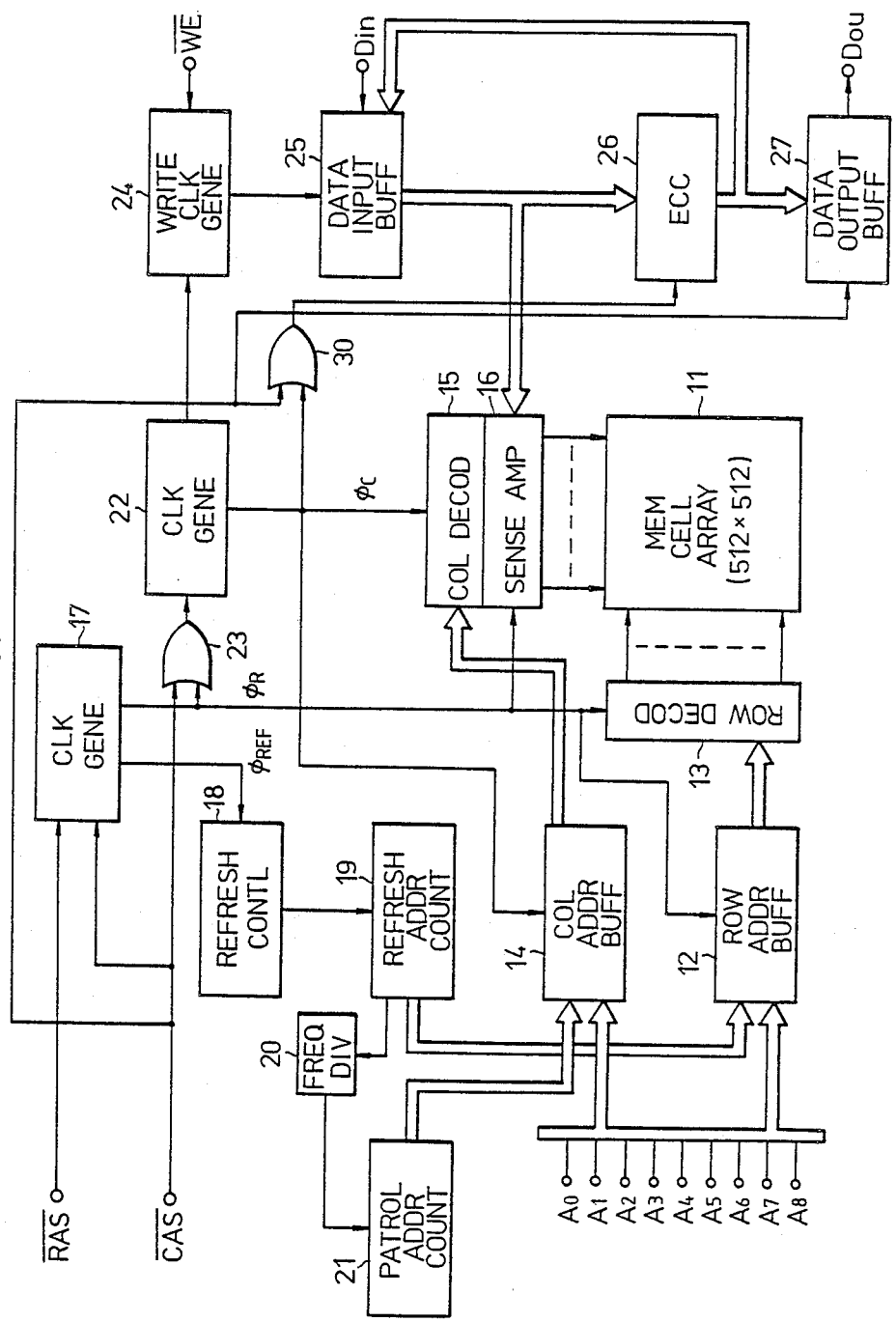
FIG. 10 is a system block diagram showing a second embodiment of the device for refreshing a dynamic semiconductor memory device according to the present invention.

Next, description will be given with respect to a second embodiment of the device for refreshing a dynamic semiconductor memory device according to the present invention, by referring to FIG. 10. In the present embodiment, the device of the present invention is applied to a DRAM having a built-in ECC circuit, and the refresh operations are performed in accordance with the timing charts shown in FIGS. 8(A) through 8(C) and 9(A) through 9(C). In FIG. 10, those parts which are the same as those corresponding parts in FIG. 4 are designated by the same reference numerals, and description thereof will be omitted.

The circuit shown in FIG. 10 differs from the circuit shown in FIG. 4 in that the circuit shown in FIG. 10 does not have the ECC discriminating circuit 28 and the NOR circuit 29. In FIG. 10, the $\overline{CAS}$ signal and the clock signal $\phi_R$ from the row-side clock generator 17 are supplied to the OR circuit 23, and the gated $\overline{CAS}$ signal is supplied to the column-side clock generator 22. Furthermore, the ECC circuit 26 is supplied with an output signal of an OR circuit 30 and not the output signal of the column-side clock generator 22. The OR circuit 30 is supplied with the $\overline{CAS}$ signal and the clock signal $\phi_C$ from the column-side clock generator 22.

All of normal access operations such as the read operation are started when the $\overline{RAS}$ signal becomes low in a state where the $\overline{CAS}$ signal is high, and the $\overline{CAS}$ signal becomes low after the $\overline{RAS}$ signal becomes low. As a result, the read cycle is performed when the clock signal $\phi_R$ is generated from the row-side clock generator 17 and L the clock signal $\phi_C$ is thereafter generated from the column-side clock generator 22. Since the the $\overline{CAS}$ signal and the clock signal $\phi_R$ are supplied to the OR circuit 23, the output gated $\overline{CAS}$ signal of the OR circuit 23 is high when the $\overline{RAS}$ signal becomes high even when the $\overline{CAS}$ signal is low. The column-side clock generator 22 is supplied with the gated $\overline{CAS}$ signal from the OR circuit 23, and thus, the column-side circuits are automatically activated responsive to the clock signal $\phi_C$. In the read cycle, the ECC circuit 26 is set at a standby mode responsive to the output signal of the OR circuit 30 at the same time as activating the column-side circuits, and the ECC circuit 26 checks the output data $D_{OUT}$ which is to be outputted via the data output buffer 27. In the page mode, the ECC circuit 26 is activated every time responsive to the toggle of the $\overline{CAS}$ signal, and it is hence possible perform the error checking and correcting operation.

When the $\overline{CAS}$ signal is high when the $\overline{RAS}$ signal becomes high from the time t0 to the time t1 as shown in FIGS. 8(A) and 8(B), the row-side clock generator 17 operates the refresh control circuit 18 and the row-side circuits including the row address buffer 12, the row decoder 13 and the sense amplifier 16. However, since the $\overline{CAS}$ signal becomes high within a predetermined time, the gated $\overline{CAS}$ signal from the OR circuit 23 is prevented from becoming low and the column-side clock generator 22 is accordingly prevented from operating. Thus, the column-side circuits including the column decoder 15 will not operate. When the $\overline{CAS}$ signal is made high immediately the after the $\overline{RAS}$ signal becomes low so as to shorten refresh, the output signal of the OR circuit 30 is maintained high and the operation of the ECC circuit 26 is prevented.

On the other hand, during the refresh operation from the time t0 to the time t1 and the refresh operation from the time t2 to the time t3 in FIGS. 9(A) and 9(B), the $\overline{RAS}$ signal is toggled in the state where the $\overline{CAS}$ signal is maintained low so that column-side circuits are activated responsive to the clock signal $\phi_C$ for each refresh and the ECC circuit 26 is operated responsive to the output signal of the OR circuit 30. As a result, the output data $D_{OUT}$ to be outputted via the data output buffer 27 is checked by the ECC circuit 26, and in case of error the correct data is written to replace the erroneous data via the data input buffer 25. In FIG. 9(A), the toggle width of the $\overline{RAS}$ signal must be greater than that of the $\overline{RAS}$ signal shown in FIG. 8(A) by an amount corresponding to the error checking and correcting that is performed by the ECC circuit 26.

Therefore, when the circuit shown in FIG. 10 is operated by the $\overline{RAS}$ and $\overline{CAS}$ signals having the timings shown in FIGS. 8(A) and 8(B), the refresh operation without the error checking and correcting operation of the ECC circuit 26 is performed. On the other hand, when the circuit is operated by the $\overline{RAS}$ and $\overline{CAS}$ signals having the timings shown in FIGS. 9(A) and 9(B), the refresh operation with the error checking and correcting operation of the ECC circuit is performed.

According to the present embodiment, the column-side clock generator 22 is supplied with the gated $\overline{CAS}$ signal from the OR circuit 23. For this reason, the ECC circuit 26 is operated during the normal access operation including the read cycle, the RAS-CAS mode and the page mode.

Therefore, according to the present invention, it is possible to selectively perform the refresh operation with the error checking and correcting only once in a predetermined number of refresh operations performed without the error checking and correcting. As a result, compared to the case where all of the refresh operations are performed with the error checking and correcting, the increases in the refresh overhead time and the power consumption are substantially negligible.

For example, when the refresh operation with the error checking and correcting is performed only once in every 64 refresh operations, the period of the ECC patrol increases from approximately 8 sec to approximately 9 min in the case of the 1 Mb DRAM described before. Hence, the frequency of the error checking and correcting accordingly becomes low. However, even when the near future DRAM having an extremely high integration density is taken into consideration, the soft error rate would be in the order of 1000 FIT (once in every 1,000,000 times) to 10000 FIT (once in every 100,000 times) at the worst. This means that it is not essential to perform the error checking and correcting in intervals of seconds and that it is sufficient from the practical point of view to perform the error checking and correcting in intervals of minutes. Thus, no problems are introduced from the practical point of view even when the frequency of the error checking and correcting is slightly lowered.

The ECC circuit 26 in FIGS. 4 and 10 may be designed to perform the error checking and correcting according to the bi-directional checking or the error checking using the Hamming code, for example. The error checking using the Hamming code can check a large number of bits simultaneously, and the error checking efficiency is superior compared to that of the bi-directional checking. For this reason, it is easier to lower the frequency of the error checking and correcting in the case of the error checking using the Hamming code.

In the embodiments described heretofore, the refresh modes with and without the error checking and correcting are selectively performed depending on the timings of the $\overline{RAS}$ and $\overline{CAS}$ signals, and it is unnecessary to provide an additional input terminal on the memory device for discriminating whether the refresh operation is to be performed with or without the error checking and correcting. On the other hand, it is possible to design the memory device so as to automatically perform the refresh operation with the error checking and correcting once in every 64 refresh operations, for example. However, in this case, there is a disadvantage in that it would require additional means for discriminating from outside of the memory device whether the present refresh operation is being performed with or without the error checking and correcting.

Further, the present invention is not limited to these embodiments, but various variations and modifications may be made without departing from the scope of the present invention.

What is claimed is:

1. A method of refreshing a dynamic semiconductor memory device comprising a memory cell array having a matrix arrangement of memory cells each designated by an externally generated row address and an externally generated column address and an error checking and correcting circuit, said externally generated row address being received in response to a row address strobe signal, said externally generated column address being received in response to a column address strobe singal, said method comprising the steps of:
    determining that a refresh operation is to be performed in the dynamic semiconductor memory device based on the timing relationship of said row and column address strobe signals, when said column address strobe signal changes to an active state before said row address strobe signal; and
    selectively performing said refresh operation with and without an error checking and correcting operation of the error checking and correcting circuit by discriminating whether said refresh operation is to be performed with or without the error checking and correcting circuit, based on the timing relationship of said row and column address strobe signals.

2. A method of refreshing a dynamic semiconductor memory device as claimed in claim 1 in which said refresh operation is performed without said error checking and correcting operation when said row address strobe signal toggles while said column address strobe signal remains low, and said refresh operation is performed with said error checking and correcting operation when said column address strobe signal toggles in synchronism with said row address signal which toggles.

3. A method of refreshing a dynamic semiconductor memory device as claimed in claim 1 in which said refresh operation is performed with said error checking and correcting operation when said row address strobe signal toggles while said column address strobe signal remains low, and said refresh operation is performed without said error checking and correcting operation when said column address strobe signal toggles in synchronism with said row address signal which toggles.

4. A device for refreshing a dynamic semiconductor memory device comprising a memory cell array having a matrix arrangement of memory cells each designated by an externally generated row address and an externally generated column address and an error checking and correcting circuit, said externally generated row address being received in response to a row a row address strobe signal, said externally generated column address being received in response to a column address strobe signal, said device comprising:
   input terminals supplied with the row address strobe signal and the column address strobe signal;
   a discriminating circuit for discriminating whether a refresh operation is to be performed with or without an error checking and correcting operation of said error checking and correcting circuit, based on the timing relationship of said row and column address strobe signals, and for producing a discrimination signal having a level indicative of a discriminated result;
   a row-side clock generating circuit for producing a first clock signal for controlling row-side circuits of the dynamic semiconductor memory device responsive to said row and column address strobe signals and for producing a first control signal when said column address strobe signal changes to an active state before said row adress strobe signal;
   a column-side clock generating circuit for producing a second clock signal for controlling row-side circuits of the dynamic semiconductor memory device responsive to said discrimination signal and said column address strobe signal; and
   a refresh control circuit for refreshing the dynamic semiconductor memory device responsive to said first control signal from said row-side clock generating circuit,
   said error checking and correcting circuit being controlled responsive to a second control signal produced from siad column-side clock generating circuit.

5. A device for refreshing a dynamic semiconductor memory device as claimed in claim 4 in which said refresh control circuit is operated responsive to said first control signal and said error checking and correcting circuit is not operated by said second control signal when said row address strobe signal toggles while said column address strobe signal remains low, and said refresh control circuit is operated responsive to said first control signal and said error checking and correcting circuit is operated by said second control signal when said column address strobe signal toggles in synchronism with said row address strobe signal which toggles.

6. A device for refreshing a dynamic semiconductor memory device as claimed in claim 5 in which said refresh control circuit is operated responsive to said first control signal and said error checking and correcting circuit is operated by said second control signal when each fall in said column address strobe signal occurs immediately before a rise in said row address strobe signal and each rise in said row address strobe signal occurs immediately before a fall in said column address strobe signal.

7. A device for refreshing a dynamic semiconductor memory device as claimed in claim 4 wherein said column-side clock generating circuit comprises a second control circuit including a first gate circuit supplied with said column address strobe signal and said first clock signal for obtaining a gated column address strobe signal, and a second gate circuit supplied with said discrimination signal and said gated column address strobe signal, said second control circuit producing said second clock signal responsive to an output signal of said second gate circuit.

8. A device for refreshing a dynamic semiconductor memory device as claimed in claim 7 in which said second control circuit further includes delay means for producing said second control signal by delaying said second clock signal.

9. A device for refreshing a dynamic semiconductor memory device as claimed in claim 4 in which said error checking and correcting circuit is a built-in circuit of said dynamic semiconductor memory device.

10. A device for refreshing a dynamic semiconductor memory device comprising a memory cell array having a matrix arrangement of memory cells each designated by an externally generated row address and an externally generated column address and an error checking and correcting circuit, said externally genrated row address being received in response to a row address strobe signal, said externally generated column address being received in response to a column address strobe signal, said device comprising:
   input terminals supplied with the row address strobe signal and the column address strobe signal;
   a row-side clock generating circuit for producing a first clock signal for controlling row-side circuits of the dynamic semconductor memory device responsive to said row and column address strobe signals and for producing a first control signal when said column address strobe signa changes to an active state before said row address strobe signal;
   a column-side clock generating circuit for producing a second clock signal for controlling column-side circuits of the dynamic semiconductor memory device responsive to said column address strobe signal and said first clock signal;
   a refresh control circuit for refreshing the dynamic semiconductor memory device responsive to said first control signal from said row-side clock genrating circuit; and
   a gate circuit supplied with said column address strobe signal and said second clock signal for producing a second control signal, said error checking and correcting circuit being controlled responsive to said second control signal produced from said gate circuit.

11. A device for refreshing a dynamic semiconductor memory device as claimed in claim 10 in which said refresh control circuit is operated responsive to said first control signal and said error checking and correcting circuit is operated by said second control signal when said row address strobe signal toggles while said column address strobe signal remains low, and said refresh control circuit is operated responsive to said first control signal and said error checking and correcting circuit is not operated by said second control signal when said column address strobe signal toggles in synchronism with said row address strobe signal which toggles.

12. A device for refreshing a dynamic semiconductor memory device as claimed in claim 11 in which said refresh control circuit is operated responsive to said first control signal and said error checking and correcting circuit is not operated by said second control signal when each fall in said column address strobe signal occurs immediately before a rise in said row address strobe signal and each rise in said row address strobe signal occurs immediately before a fall in said column address strobe signal.

13. A device for refreshing a dynamic semiconductor memory device as claimed in claim 10 in which said column-side clock generating circuit comprises an OR circuit supplied with said column address strobe signal and said second clock signal for obtaining a gated column address strobe signal, said column-side clock generating circuit producing said second clock signal responsive to said gate column address strobe signal.

14. A device for refreshing a dynamic semiconductor memory device as claimed in claim 10 in which said error checking and correcting circuit is a built-in circuit of said dynamic semiconductor memory device.

* * * * *